LOGARITHMIC AMPLIFIER

Filed May 20, 1966

INVENTOR.
PAUL E. HARRIS
BY Philip Schneider
ATTORNEY.

INVENTOR
PAUL E. HARRIS
BY Philip Schneider
ATTORNEY

United States Patent Office 3,448,289
Patented June 3, 1969

3,448,289
LOGARITHMIC AMPLIFIER

Paul E. Harris, Syracuse, N.Y., assignor, by mesne assignments, to the United States of America as represented by the Secretary of the Navy Filed May 20, 1966, Ser. No. 551,775
Int. Cl. G06g 7/24
U.S. Cl. 307—230 2 Claims This invention relates to logarithmic amplifiers and especially to a diode-type logarithmic amplifier in which the bias of the logging diode is automatically stabilized.

A logarithmic amplifier (hereinafter referred to as a log amplifier) is a voltage amplifier having a large gain for small input signals and a small although not zero, gain for large signals. Ideally, the output voltage should be proportional to the logarithm of the input voltage, hence the name. Such an amplifier can handle a very wide range of input-signal amplitudes without saturation. It provides a dynamic range transformation that is valuable in radar systems and in some computer applications. A log amplifier can be connected to a crystal detector to form a simple untuned microwave receiver.

Some desirable attributes of a log amplifier are stability with temperature variations, short recovery time, suitability for high duty-cycle pulses, wide bandwidth, high sensitivity, simplicity of design, simplicity of adjustment and large dynamic range. Log amplifiers incorporating some of these features have been available for some time. However, some of the desirable features are mutually exclusive. It is particularly difficult to reconcile the simultaneous requirements of wide dynamic range, high sensitivity, and high duty cycle with short recovery time following overload. (Recovery time is that period, following an execessively large input signal, during which a small input signal will be masked and will not appear at the output.) The present circuit provides a fairly optimum combination of all of these desirable features.

The objects and advantages of the present invention are accomplished by the automatic stabilization of the bias of the logging diode of a diode-type log amplifier.

An object of this invention is to provide a log amplifier having close to an optimum combination of desirable characteristics, especially those of wide dynamic range, high sensitivity, high duty cycle and short recovery time following overload.

Another object is to provide a log amplifier capable of handling low-level input signals and yet having a wide dynamic range.

A further object is to provide for automatic stabilization of the bias of the logging diode of a diode-type logarithmic amplifier.

Other objects and many of the attendant advantages of this invention will be readily appreciated as the same becomes better understood by reference to the following detailed description when considered in connection with the accompanying drawings wherein.

Prior log amplifier designs have employed the following approaches:

(1) Progressive saturation of cascaded amplifier stages may be used with a resistor matrix to provide a composite output.

(2) Several quasi-log stages, each having a small dynamic range, may be cascaded.

(3) A subcarrier and modulator may be used in one design.

(4) The voltage-current characteristic of a diode may be used directly for logging.

The last approach is the one which is most commonly used today. Many semiconductor diodes may be used to approximate a log-arithmic transfer function (e.g., the type 1N916 and1N3605 diodes which are planar epitaxial silicon diodes). When biased in the forward current mode, the voltage across such a diode is approximately proportional to the log of the diode current. This fact is the basis of most log amplifier designs. The input can be placed across a resistor-diode combination and the output can be taken across the diode. If the input voltage is large compared to the output voltage (a few tenths of a volt) and the diode is connected properly with respect to the polarity of the input voltage, the diode current will be proportional to the input voltage ($V_{IN}/R$). Thus, the output voltage will be proportional to the log of the input voltage.

The problem with this simple circuit is that the input voltage must be large with respect to the output voltage. The circuit then is not a log amplifier but a logarithmic attenuator. In this form, signals from 1 volt to 100 volts or more might be processed, but not low-level signals.

Figure 1:
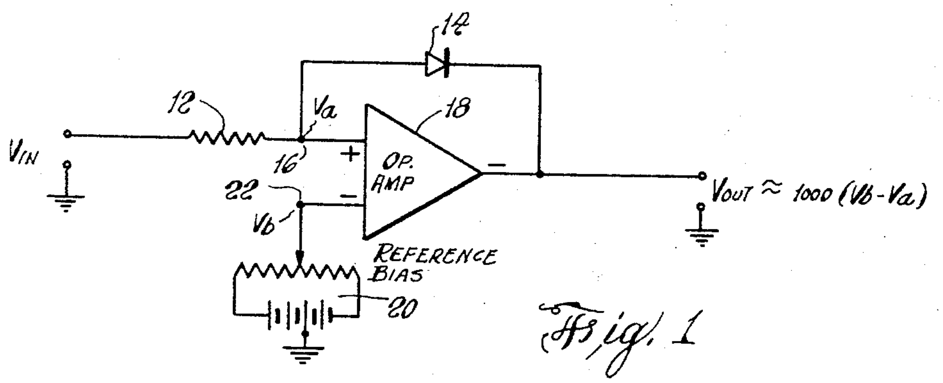
FIG. 1 is a schematic circuit diagram of a log amplifier employing a logging diode and an operational amplifier.

FIGURE 1 shows how the simple series resistor (12)-diode (14) combination may be combined with differential operational amplifier 18 to process lower-level signals. The differential amplifier has two input terminals and one output terminal, one of the input terminals receiving the circuit input signal and the other receiving a reference bias voltage.

An operational amplifier is used to perform mathematical operations, as in a computer. It has a low output impedance, a high input impedance, a signal phase shift of 180 degrees and a very high gain (greater than 100). Because of the high amplification, the voltage change at the summing point 16 is always infinitesimal. Since the voltage at the summing point $V_a$ is essentially zero, log operation is satisfactory with inputs as low as a tenth of a volt. The reference bias is obtained here from a simple series combination of a battery and a potentiometer.

The circuit shown in FIG. 1 is unsatisfactory if logarithmic amplification of very small signals (e.g., 0.1 millivolt to 0.1 volt) is required. The difficulty results from the very severe bias requirement at the amplifier reference-bias terminal 22. For example, for a silicon diode at a temperature of 25 degrees C., the desired forward bias across the logging diode 14 is approximately 200 millivolts. This bias voltage is only two times as large as a 0.1 volt input, but is 2000 times as large as a 0.1 millivolt signal. Thus, the accuracy tolerances become prohibitive. Since one terminal of the logging diode 14 is connected to the amplifier output, the diode bias voltage is critically dependent on the potential difference between the summing voltage and the reference bias $V_a$ and $V_b$, respectively. Any error in this difference is exaggerated by the amplifier gain which is typically 1000. Manual adjustment of a bias potentiometer as suggested in FIG. 1, while possible in a controlled laboratory experiment, is not generally practical. What is required, therefore, is an automatic means for providing the correct bias across the logging diode 14.

Figure 2:
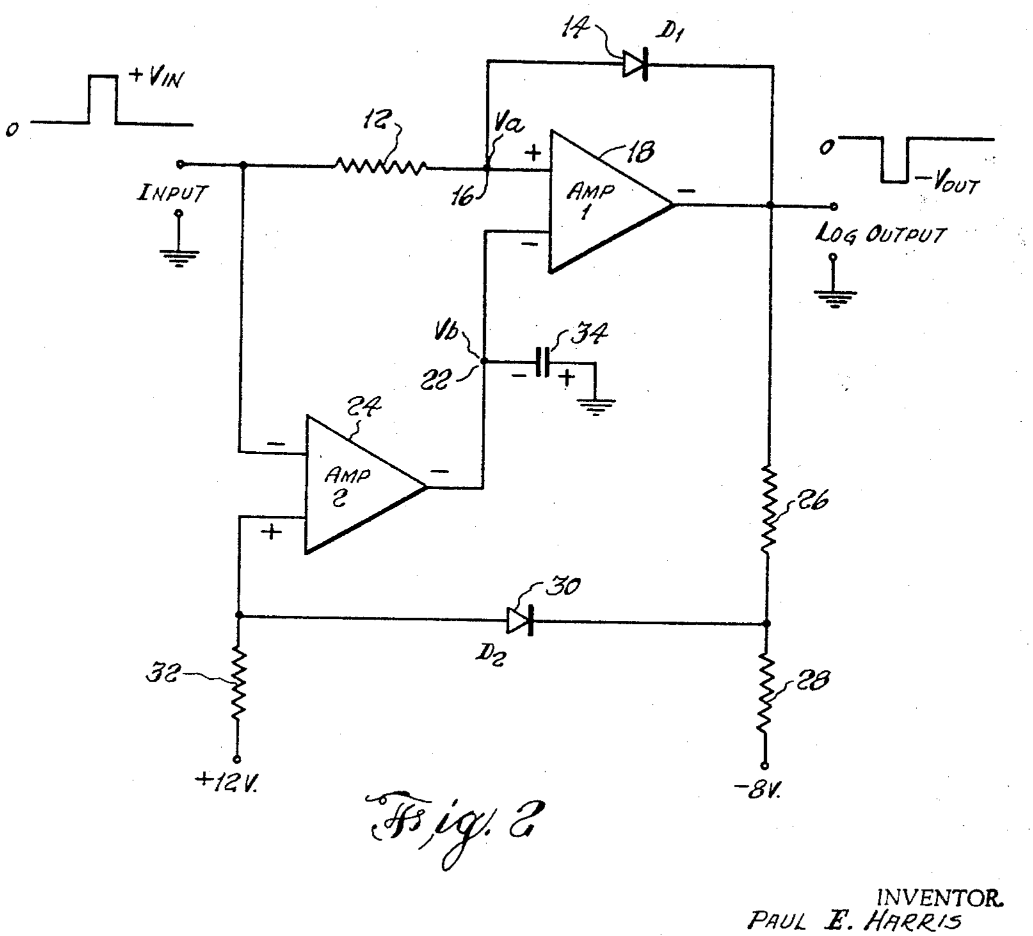
FIG. 2 is a schematic of the concept underlying the invention.

FIGURE 2 illustrates how automatic bias stabilization can be provided through servo feedback technique. A second operational amplifier 24 (which will hereinafter be called the "bias stabilization amplifier") is used to measure the bias voltage across the logging diode 14. (The quiescent voltage across the input resistor 12 may be neglected.) The voltage divider composed of resistors 26 and 28 provides the bias reference voltage for the bias stabilization amplifier 24. Forward bias for the temperature compensation diode 30 is provided by resistor 32.

Any departure of the bias of the logging diode 14 from the reference value causes the output of the bias stabilization amplifier 24 to change the input bias of the difference amplifier 18 by an appropriate amount, i.e., that change in bias which is just sufficient to reestablish equilibrium in the feedback loop. Thus, the quiescent bias of the logging diode 14 may be made independent of the severe tolerance problems.

Of course, the bias must not be disturbed by the presence of video input signals. Bias-error integrating capacitor 34 and the unsymmetrical polarity response of the bias stabilization amplifier 24 provide the required isolation. The net effect is similar to the action of a common DC restorer circuit.

The particular circuit illustrated in FIGURE 2 is designed to process positive-going input pulses. Therefore, the bias stabilization amplifier 24 is designed for a negligible output current (24 microamperes) during a positive excursion of the input pulse; but output current may be as high as 1000 microamperes for a negative excursion. The bias-error integrating capacitor 34 integrates this error current to produce a correction voltage at the negative input of the difference amplifier 18. The small error current is present during the input-signal-pulse duration. The large error current is developed whenever the input signal falls to its baseline (e.g., to zero). Therefore, the dominant correction occurs as the pulse falls to its baseline and the circuit (the bias stabilization amplifier 24 and its associated components) behaves as does a conventional DC restorer in a radar set.

The bias-error integrating capacitor 34 is the only capacitor affecting the low-frequency response in the log amplifier and may be made arbitrarily large to accommodate any length of pulse. All other capacitors (see FIGURE 3) affect only the high-frequency response of the system and insure stability by preventing parasitic oscillation.

Figure 3:
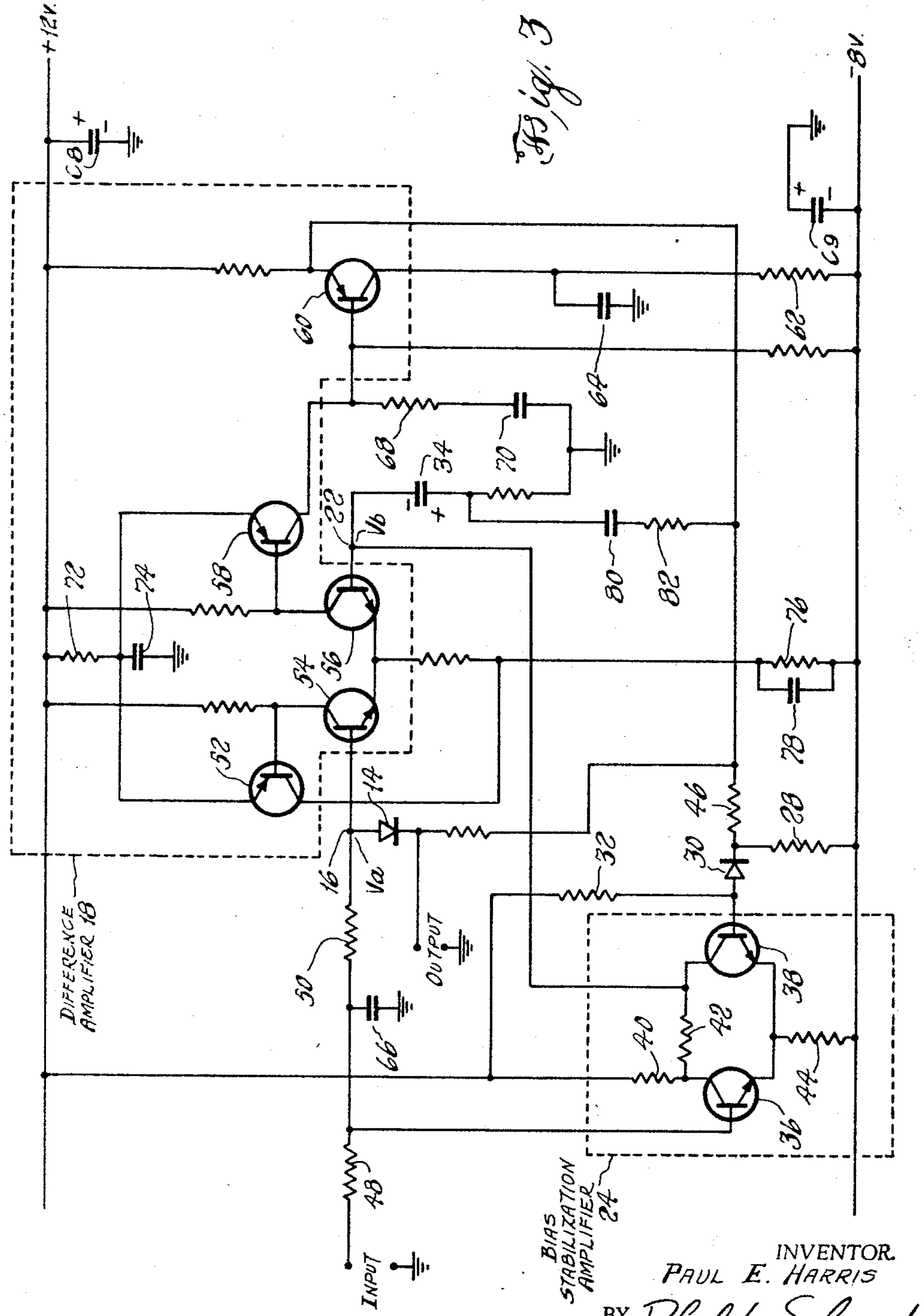
FIG. 3 is a schematic circuit diagram of a preferred embodiment of the invention consistent wtih the schematic shown in FIG. 2.

FIGURE 3 is a schematic circuit diagram showing the details of a preferred embodiment of the invention which is consistent with the underlying concept illustrated in FIG. 2. Transistors $Q_1$ (36) and $Q_2$ (38) and resistors $R_3$, $R_4$ and $R_5$ (40, 42 and 44, respectively), serve as the bias stabilization amplifier 24.

Diode $D_2$ (30) is the temperature-compensating diode and is provided with forward bias by resistor $R_6$ (32). Capacitor $C_4$ (34) is the bias-error integrating capacitor. The bias of the logging diode $D_1$ (14) is set by resistors $R_7$ (28) and $R_8$ (46) in the bias stabilization network. The input signal, a positive pulse, is applied to logging diode $D_1$ (14) through logging resistors $R_1$ (48) and $R_2$ (50).

Components of the difference amplifier (14) in this figure include a basic difference amplifier and an emitter follower. The basic difference amplifier includes transistors $Q_3$ (52), $Q_4$ (54), $Q_5$ (56) and $Q_6$ (58) and their associated components. Transistor $Q_7$ (60) and its associated components form an emitter follower stage which provides the low output impedance desired of the difference amplifier 18. Resistor $R_{19}$ (62) and capacitor $C_6$ (64) form a power-supply decoupling network for transistor $Q_7$. Resistor $R_1$ (48) and capacitor $C_1$ (66) form a low-pass filter which aids stability by minimizing the effect of stray coupling between input-output cables of the log amplifier. Resistor $R_{17}$ (68) and capacitor $C_5$ (70) form a phase-correction network at the difference amplifier output. Further phase correction is provided by resistor $R_{11}$ (72) and capacitor $C_2$ (74) and by resistor $R_{14}$ (76) and capacitor $C_7$ (78). Phase correction is essential in this closed-loop system and is particularly difficult since, for this deliberate nonlinear design, the amplifier feedback ration is itself a variable.

Resistor $R_{15}$ (80) and capacitor $C_3$ (82) are optional components which are useful for high-frequency peaking, whereby an improvement in pulse response is possible. Layout or construction practices determine whether this network is needed, since some unintended feedback always occurs when a circuit is built.

Minor trim of resistor $R_7$ (28) may be required for the best approximation to a logarithmic transfer function. Best results are obtained if the log amplifier is buffered at both input and output terminals. Simple emitter followers are satisfactory.

The following is a list of typical values for the components shown in FIGURE 3.

| | | |
|---|---|---|
| Transistor: | | |
| $Q_1$, $Q_2$, $Q_4$, $Q_5$, type | | 2N2369 |
| $Q_3$, $Q_6$, $Q_7$, type | | 2N2894 |
| Diode $D_1$, $D_2$, type | | 1N3605 |
| Resistor: | | |
| $R_1$ | ohms | 100 |
| $R_2$ | do | 390 |
| $R_3$ | do | 1000 |
| $R_4$ | do | 470K |
| $R_5$ | do | 8.2K |
| $R_6$ | do | 100K |
| $R_7$ | do | 15K |
| $R_8$ | do | 1K |
| $R_9$ | do | 470 |
| $R_{10}$ | do | 2.2K |
| $R_{11}$ | do | 330 |
| $R_{12}$ | do | 2.2K |
| $R_{13}$ | do | 1K |
| $R_{14}$ | do | 2.7K |
| $R_{15}$ | do | 1K |
| $R_{16}$ | do | 10 |
| $R_{17}$ | do | 100 |
| $R_{18}$ | do | 2.7K |
| $R_{19}$ | do | 100 |
| $R_{20}$ | do | 3.3K |
| Capacitor: | | |
| $C_1$ | pf | 100 |
| $C_2$ | pf | 240 |
| $C_3$ | pf | 68 |
| $C_4$ | mfd | 10 |
| $C_5$ | pf | 100 |
| $C_6$ | pf | 330 |
| $C_7$ | pf | 2200 |
| $C_8$ | mfd | 10 |
| $C_9$ | mfd | 10 |

Obviously many modifications and variations of the present invention are possible in the light of the above teachings.

I claim:

1. In a logarithmic amplifier circuit of the type in which the input voltage is placed across a series resistor-logging diode combination, the signal input terminal and the output terminal of a first differential operational amplifier are connected across the logging diode, and the logarithmic output voltage of the circuit is derived from the current through said diode, the improvement comprising a circuit for the automatic stabilization of the bias of the logging diode comprising:

a second differential operational amplifier connected across said logging diode to receive at its input terminals a voltage proportional to the bias existing across said diode, the output terminal of said second differential operational amplifier being connected to the reference-bias input terminal of said first differential operational amplifier, whereby any change in bias across said diode results in a change in reference-bias voltage at the input of said first differential operational amplifier which compensates for said change in bias across said diode;

a bias-error integrating capacitor connected to the output terminal of said second differential amplifier; and reference-bias source means connected to the reference-bias terminal of said second differential amplifier.

2. A logarithmic amplifier circuit as set forth in claim 1, further including a temperature-compensating diode connected between the reference-bias terminal of said second differential amplifier and said reference-bias source means.

References Cited

UNITED STATES PATENTS

| | | | |
|---|---|---|---|
| 2,801,296 | 7/1957 | Blecher | 330—9 |
| 2,935,687 | 5/1960 | Eschner | 328—145 |
| 3,015,074 | 12/1961 | Taskett | 330—9 |
| 3,065,428 | 11/1962 | Richman | 330—9 |
| 3,108,197 | 10/1963 | Levin | 328—145 XR |
| 3,320,532 | 5/1967 | Watters | 328—145 XR |
| 3,329,836 | 7/1967 | Pearlman et al. | 328—145 XR |
| 3,374,361 | 3/1968 | Callis | 328—145 XR |
| 3,393,369 | 7/1968 | Embley et al. | 307—229 XR |

ARTHUR GAUSS, *Primary Examiner.*

S. T. KRAWCZEWICZ, *Assistant Examiner.*

U.S. Cl. X.R.

307—296; 328—145; 330—9, 85